US006950368B2

(12) United States Patent
Morgan

(10) Patent No.: US 6,950,368 B2
(45) Date of Patent: Sep. 27, 2005

(54) LOW-VOLTAGE SENSE AMPLIFIER AND METHOD

(75) Inventor: Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 10/374,376

(22) Filed: Feb. 25, 2003

(65) Prior Publication Data

US 2004/0165462 A1 Aug. 26, 2004

(51) Int. Cl.[7] .............................. G11C 7/02; G11C 8/00
(52) U.S. Cl. .................. 365/230.03; 365/207; 365/233
(58) Field of Search .......................... 365/230.03, 201, 365/205, 207, 208, 222, 233; 327/51, 52

(56) References Cited

U.S. PATENT DOCUMENTS

| 4,451,906 A | * | 5/1984 | Ikeda ........................ 365/207 |
| 5,548,231 A | * | 8/1996 | Tran ........................... 327/52 |
| 5,696,726 A | * | 12/1997 | Tsukikawa .................. 365/207 |
| 5,936,905 A | * | 8/1999 | Proebsting ................. 365/208 |
| 6,031,776 A | * | 2/2000 | Chen et al. ................ 365/207 |
| 6,191,981 B1 | * | 2/2001 | Hong ......................... 365/207 |
| 6,255,862 B1 | * | 7/2001 | Kumagai et al. ............ 327/51 |
| 6,459,635 B1 | * | 10/2002 | Mullarkey et al. ......... 365/201 |

\* cited by examiner

*Primary Examiner*—Trong Phan
(74) *Attorney, Agent, or Firm*—Dorsey & Whitney LLP

(57) ABSTRACT

A first sense amplifier has complementary inputs and outputs coupled between a pair of complementary sense lines. Each sense line is connected to a respective complementary digit line through a coupling transistor. The coupling transistors are activated during an initial sensing period to couple a differential voltage from the digit lines to the sense lines. The sense lines are then isolated from the digit lines to allow the first sense amplifier to respond to the differential voltage without being loaded by the capacitance of the digit lines. The sense lines are also coupled to complementary inputs of a second sense amplifier that has complementary outputs coupled to the digit lines. By coupling the inputs of the second sense amplifier to the sense lines rather than the digit lines, the differential voltage applied to the second sense amplifier increases faster than the increase of the differential voltage between the digit lines.

49 Claims, 6 Drawing Sheets

LOW-VOLTAGE SENSE AMPLIFIER AND METHOD

TECHNICAL FIELD

The invention relates to memory devices, and more particularly, to sense amplifiers used to sense differential voltages produced by memory cells in memory devices, such as dynamic random access memory ("DRAM") devices.

BACKGROUND OF THE INVENTION

Memory devices, such as static random access memory ("SRAM") devices and dynamic random access memory ("DRAM") devices are in common use in a wide variety of electronic systems, such as personal computers. Memory devices include one or more arrays of memory cells, which, in DRAM devices, are small capacitors that are arranged in rows and columns. A portion of a conventional DRAM memory array 10 is shown in FIG. 1. The array 10 includes a pair of complementary digit lines DL, DL* for each column of the array 10, only one pair of which is shown in FIG. 1. A large number of memory cells 12 are coupled to the digit lines DL, DL*. Each of the memory cells 12 includes an access transistor 16 and a memory cell capacitor 18 coupled between the transistor 16 and a cell plate 20, which is generally biased at one-half the supply voltage, i.e., $V_{CC}/2$. The capacitor 18 generally stores a voltage equal to either the supply voltage $V_{CC}$ or ground. A gate of each access transistor 16 is coupled to a respective word line $WL_0$, $WL_1$, although only two of these word lines are shown in FIG. 1. For a "folded digit line" architecture, the even-numbered word lines, e.g., $WL_0$, are coupled to the digit lines DL, and the odd-numbered word lines, e.g., $WL_1$, are coupled to the complementary digit lines DL*. Thus, one word line WL is provided for each row of memory cells 12 in the array 10.

Each pair of digit lines DL, DL* is coupled to a respective sense amplifier 30 that performs two functions; first, "equilibrating" the digit lines and, second, sensing a differential voltage developed between the digit lines DL, DL* and then driving the digit lines to corresponding logic levels. Equilibrating the digit lines DL, DL*, which causes them to be at the same voltage, is accomplished using an equilibration circuit 34. The equilibration circuit 34 includes an equilibration transistor 36 coupled between the digit lines DL, DL*, and a pair of equilibration bias transistors 40, 42 coupled between one-half the supply voltage, i.e., $V_{CC}/2$, and respective digit lines DL, DL*.

In operation, in response to an active high equilibration EQ signal, the equilibration transistor 36 turns ON to couple the digit lines DL, DL* to each other, and the equilibration bias transistors 40, 42 turn ON to couple the digit lines DL, DL* to $V_{CC}/2$. As a result, after an equilibration period, the voltage on both of the digit lines DL, DL* is $V_{CC}/2$, and the differential voltage between the digit lines is therefore zero.

As mentioned above, the sense amplifier 30 also performs the function of sensing a differential voltage developed between the digit lines DL, DL* and then driving the digit lines to corresponding logic levels. This second function is accomplished by an NSENSE amplifier 50 and a PSENSE amplifier 52. The NSENSE amplifier 50 includes a pair of cross-coupled NMOS transistors 56, 58, and the PSENSE amplifier 52 similarly includes a pair of cross-coupled PMOS transistors 60, 62.

In operation, the digit lines DL, DL* are initially equilibrated by driving the EQ signal active high for the equilibration period. After the differential voltage between the digit lines DL, DL* has reached substantially zero volts, the EQ signal transitions inactive low to turn OFF the transistors 36, 40, 42. One of the word lines is then driven active high to turn ON the access transistor 16 to which it is coupled. The ON access transistor 16 then couples a memory cell capacitor 18 to the digit line DL or DL* to which the access transistor 16 is coupled. This voltage from the capacitor 18 causes the voltage on the digit line DL or DL* to either increase slightly (if the capacitor 18 was at $V_{CC}$) or decrease slightly (if the capacitor 18 was at ground).

A SENSE ENABLE line is then driven to a relatively low voltage, such as ground or a slight negative voltage, and an ACT line is driven to a relatively high voltage, such as $V_{CC}$ or a voltage elevated slightly above $V_{CC}$. Assuming, for example, that the voltage on the digit line DL has increased, the NMOS transistor 58 will turn ON to an extent that is greater than the amount the NMOS transistor 56 turns ON because the gate-to-source voltage of the transistor 58 will be greater. The complementary digit line DL* is therefore pulled toward the low voltage on the SENSE ENABLE line to a greater extent than the DL is pulled toward zero voltage. In a manner similar to the operation of the NSENSE amplifier 50, when the ACT line is driven high, the PMOS transistor 60 in the PSENSE amplifier 52 turns ON to an extent that is greater than the extent that the PMOS transistor 62 is turned ON because the gate-to-source voltage of the transistor 60 is larger. Therefore, the transistor 60 more strongly drives the digit line DL to $V_{CC}$. Thereafter, the voltage on the digit line DL further increases and the voltage on the complementary digit line DL* further decreases, thereby causing the transistor 60 to drive the digit line DL more strongly, and the transistor 62 to drive the complimentary digit line less strongly, to the relatively high ACT voltage. At the same time, the increased voltage on the digit line DL and the decreased voltage on the complementary digit line DL* causes the transistor 58 to drive the complementary digit line DL* more strongly, and the transistor 56 to drive the digit line DL less strongly, to the relatively low SENSE ENABLE voltage. At the end of a sensing period, the NSENSE amplifier 50 has driven the complementary digit line DL* to the relatively low SENSE ENABLE voltage, and the PSENSE amplifier 52 has driven in the digit line DL to the relatively high ACT voltage. A COLUMN SELECT signal then transitions high to turn ON input/output ("I/O") transistors 70, 72, thereby coupling the digit lines DL, DL* to respective complementary I/O lines 76, 78 in order to read a data bit from the array 10.

The sense amplifier 30 shown in FIG. 1 can also be used to read data bits from a memory array (not shown) having an open digit line architecture in essentially the same manner as explained above with reference to the folded digit line architecture shown in FIG. 1.

Although the sense amplifier 30 shown in FIG. 1 has performed well in the past, it is less able to quickly sense a differential voltage between the digit lines DL, DL* as the magnitude of the supply voltage $V_{CC}$ continues to decrease and transistor threshold voltages $V_T$ continues to decrease less rapidly, which is the trend for newer memory designs. Although the sense amplifier 30 may still correctly sense the voltage differential between the digit lines DL, DL*, the time required for the sense amplifier 30 to do so can increase to unacceptable levels.

There is therefore a need for a sense amplifier that can quickly sense a voltage differential between complementary digit lines even for a supply voltage having a relatively small magnitude.

SUMMARY OF THE INVENTION

A sense amplifier and method in accordance with the present invention includes a first sense amplifier section driving a second sense amplifier section. During a memory read operation, the first sense amplifier section is initially coupled to the digit lines for only a short period of time so that the voltage differential is applied to the first sense amplifier section. Thereafter, the first sense amplifier section is isolated from the digit lines so that the sense amplifier can respond to the differential voltage without the need to drive the relatively high capacitance digit lines. As a result, the differential voltage generated by the first sense amplifier section can increase at a relatively fast rate. While the first sense amplifier section is responding to the differential voltage, the first sense amplifier section drives the second sense amplifier section, which is coupled to the digit lines. As a result, the second sense amplifier is driven by a voltage that increases at a rate that is faster than the rate that the voltage between the digit lines increases. The sense amplifier can be used with any type of memory device that uses complementary digit lines, including a wide variety of DRAM devices as well as static random access memory ("SRAM") devices and FLASH memory devices.

DETAILED DESCRIPTION OF THE INVENTION

Figure 1:
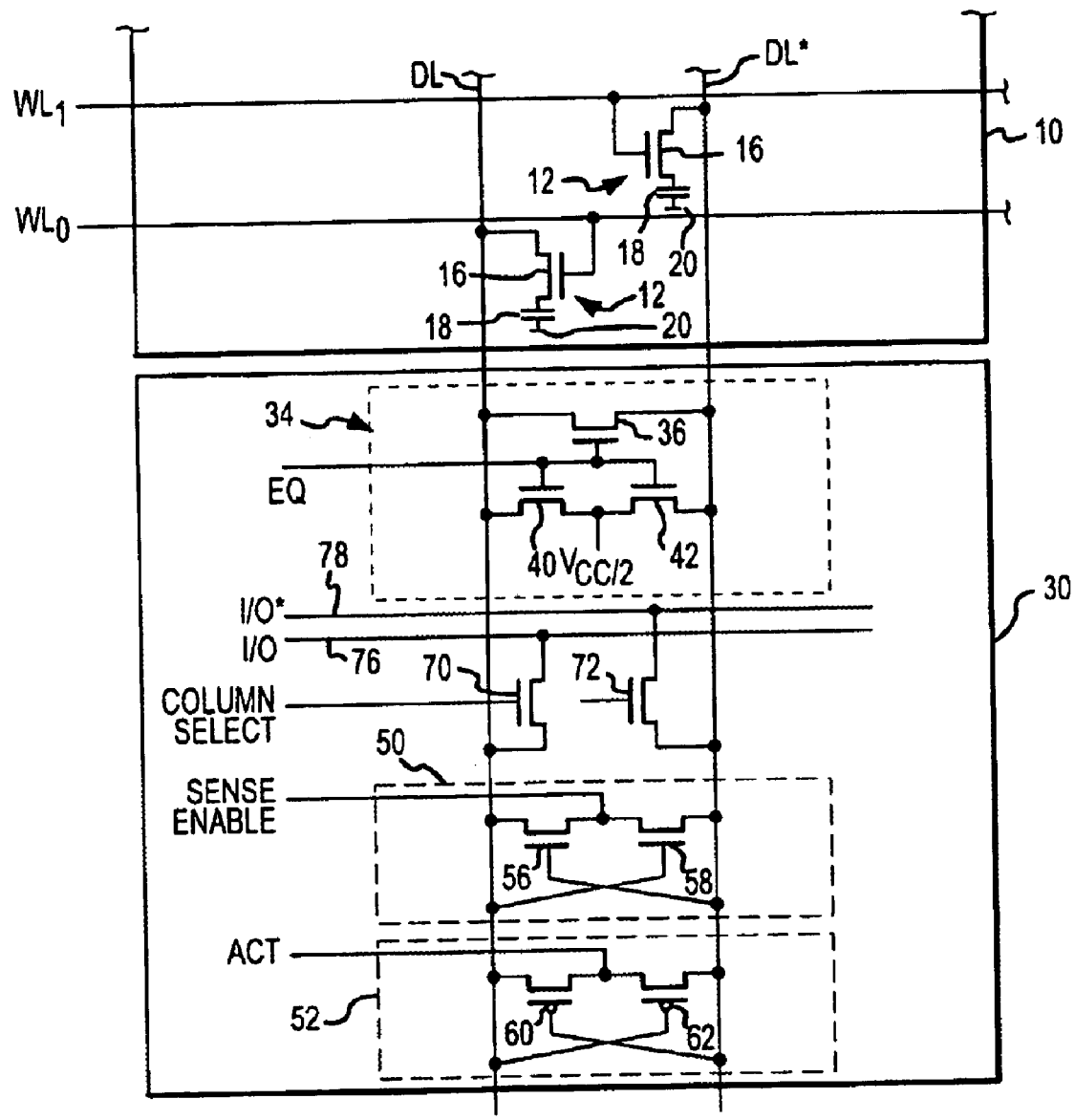
FIG. 1 is a schematic of a portion of a conventional memory array coupled to a conventional sense amplifier.
Figure 2:
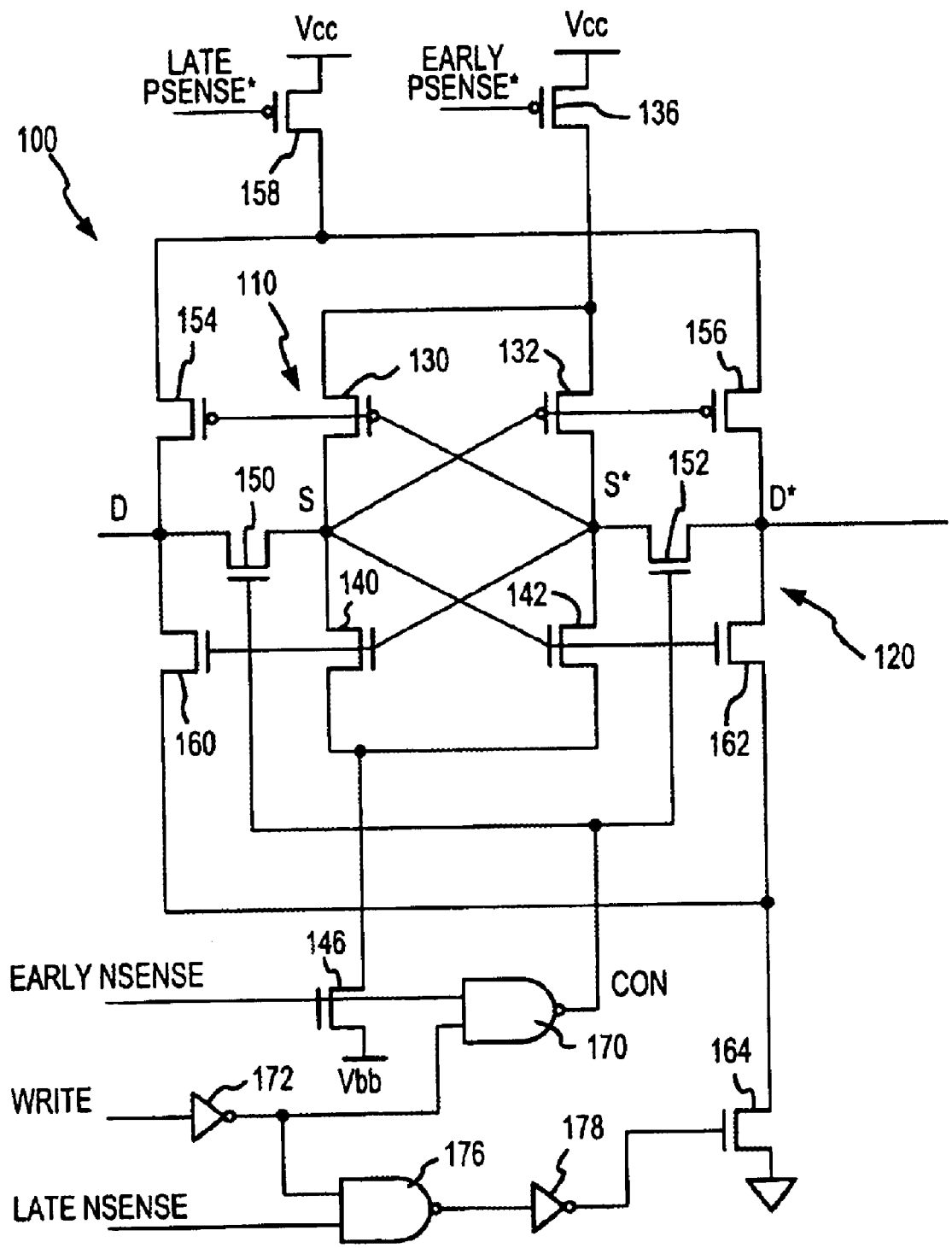
FIG. 2 is a schematic of a sense amplifier according to one embodiment of the present invention.

A sense amplifier 100 according to one embodiment of the invention is shown in FIG. 2. The sense amplifier 100 includes an inner sense amplifier section 110 and an outer sense amplifier section 120. The inner sense amplifier 110 has the same typography as the sense amplifier 10 shown in FIG. 1 except that it is coupled between a pair of complementary sense lines S, S* rather than between complementary digit lines DL, DL*. Thus, the inner sense amplifier section 110 includes a pair of cross-coupled PMOS sense transistors 130, 132 that couple respective sense lines S, S* to a supply voltage $V_{CC}$ through a PMOS positive supply transistor 136. The conductive state of the transistor 136 is controlled by an active low early PSENSE* signal. Similarly, a pair of cross-coupled NMOS sense transistors 140, 142 couple the sense lines S, S* to a relatively low supply voltage, which is preferably a negative voltage $V_{BB}$, through an NMOS negative supply transistor 146. The conductive state of the transistor 146 is controlled by an active high early NSENSE signal.

In operation, when the early PSENSE* and early NSENSE signals are active, the first sense amplifier section 110 operates in the same manner described above for the sense amplifier 10 to sense a voltage differential between the sense lines S, S* and then drive the sense lines S, S* to corresponding logic levels.

The first sense amplifier section 110 is selectively isolated from the second sense amplifier section 120 through a pair of NMOS coupling transistors 150, 152, which are controlled by an active high connect "CON" signal. The second sense amplifier section 120, like the first sense amplifier section 110, includes a pair of PMOS sense transistors 154, 156 coupled to $V_{CC}$ through a PMOS positive supply transistor 158. The conductive state of the transistor 158 is controlled by an active low late PSENSE* signal. In a similar manner, a pair of NMOS sense transistors 160, 162 are coupled to ground through an NMOS negative supply transistor 164. The conductive state of the transistor 164 is controlled by a signal that will be described below.

The second sense amplifier section 120 differs from the first sense amplifier section 110: (1) by being coupled between the digit lines DL, DL* rather than between the sense lines S, S*, and (2) by having the gates of its sense transistors 154, 156, 160, 162 coupled to the sense lines S, S* rather than to the digit lines DL, DL*. As a result, the sense transistors 154, 156, 160, 162 are not cross-coupled. The switching of the sense transistors 154, 156, 160, 162 is controlled by the voltage differential between the sense lines S, S* rather than by the voltage differential between the digit lines DL, DL* as is done with prior art sense amplifiers. Since the voltage between the sense lines S, S* can change much more rapidly than the voltage between the digit lines because of the lower capacitance of the sense lines S, S*, the sense transistors 154, 156, 160, 162 are switched at a much more rapid rate than in prior art sense amplifiers, such as the amplifier 10 shown in FIG. 1.

The CON signal used to control the conductive state of the coupling transistors 150, 152 is generated by a NAND gate 170, which receives the early NSENSE signal and the compliment of an active high WRITE signal through an inverter 172. The CON signal will therefore be active high to couple the inner sense amplifier section 110 to the outer sense amplifier section 120 if either the early NSENSE signal is inactive or the WRITE signal is active high. The WRITE signal coupled through the inverter 172 is also applied to a NAND gate 176, which also receives an active high late NSENSE signal. The NAND gate 176 will output a low to turn ON the negative supply transistor 164 through an inverter 178 if the late NSENSE signal is active and the WRITE signal is inactive low.

Figure 3:
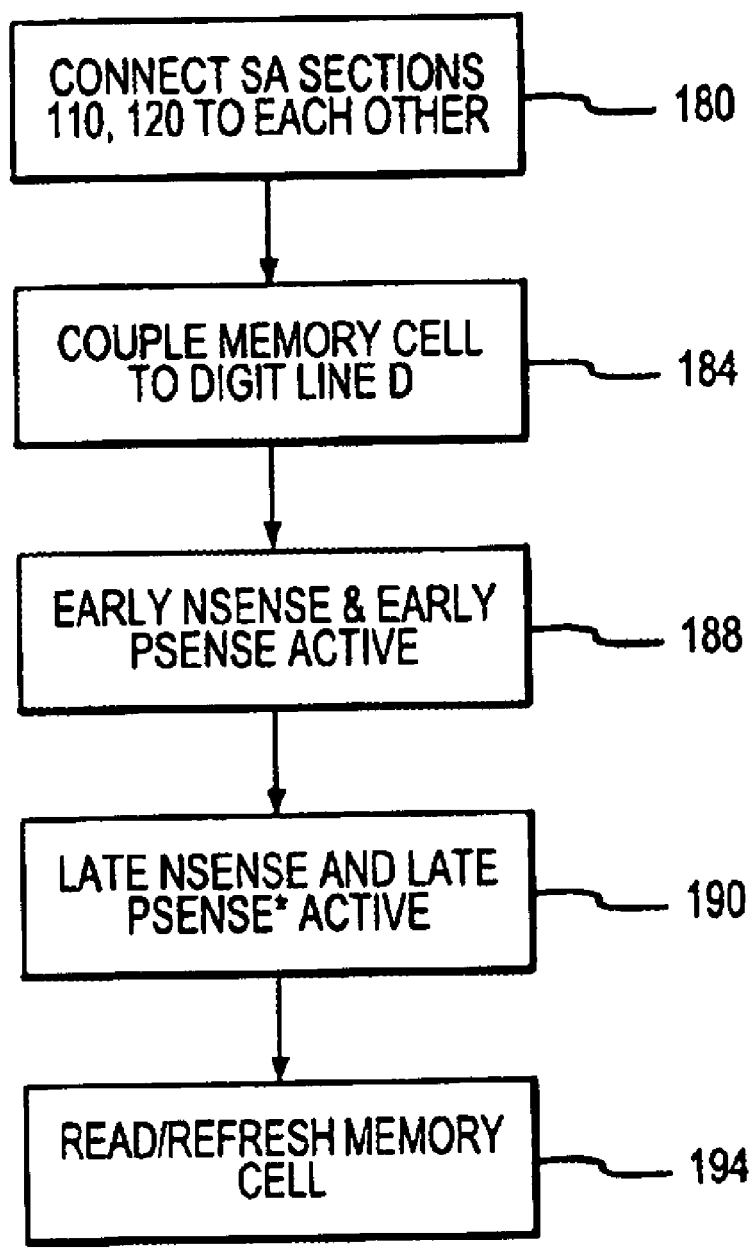
FIG. 3 is a flow chart showing the operation of the sense amplifier embodiment of FIG. 2.
Figure 4:
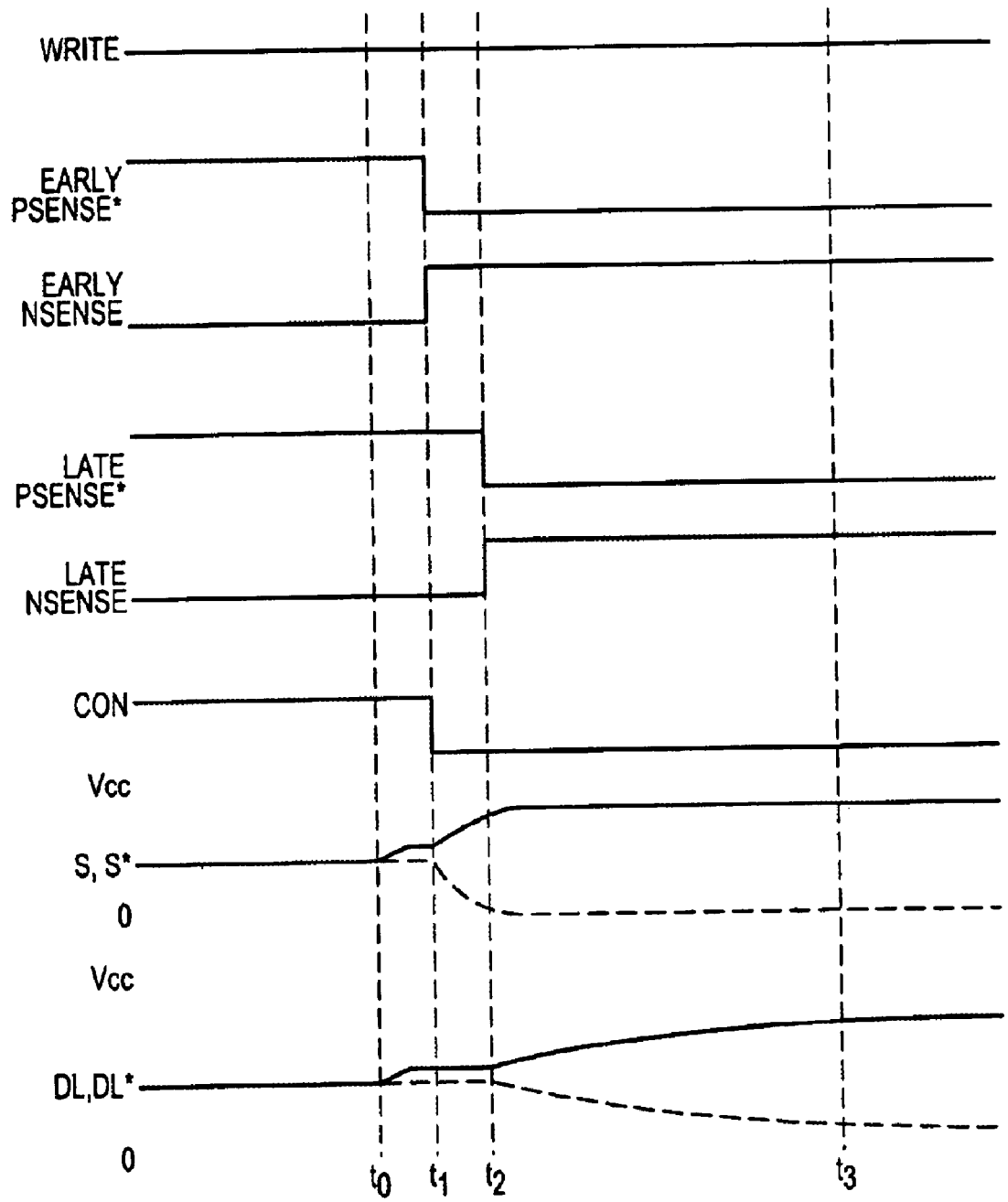
FIG. 4 is a waveform diagram showing various signals present in the sense amplifier of FIG. 2 as a function of time.

The operation of the sense amplifier 100 for a read memory access will now be explained with reference to flow chart of FIG. 3 and the waveform diagram of FIG. 4. As shown in FIG. 4, the WRITE signal is initially low and all of the other signals mentioned above are inactive. As a result, no power is applied to the sense amplifier sections 110, 120 and the CON signal is high to cause the coupling transistors 150, 152 to connect the sense amplifier sections 110, 120 to each other, which is shown at step 180. At time $t_0$, a memory cell capacitor is coupled to the digit line DL (although it could alternatively be coupled to the complementary digit line DL*), thereby causing the voltage on the digit line DL to increase slightly relative to the voltage on the complementary digit line DL* as shown at step 184. The voltage differential between the digit lines DL, DL* is also coupled to the sense lines S, S* because the coupling transistors 150, 152 are still ON.

At $t_1$, the early NSENSE and early PSENSE* signals transition to an active state at step 188, thereby applying power to the inner sense amplifier section 110. The active high early NSENSE signal also causes the NAND gate 170 to make the CON signal inactive low, which turns OFF the coupling transistors 150, 152 to isolate the inner sense amplifier section 110 from the outer sense amplifier section 120. As shown in FIG. 4, the inner sense amplifier section 110 is able to respond to the voltage differential between the sense lines S, S* much faster than the outer sense amplifier section 120 is able to respond to the voltage differential between the digit lines DL, DL* because of the much lower capacitance of the sense lines S, S* (the S signal is shown by the solid line, and the S* signal is shown by the dotted line). The voltages applied to the gates of the sense transistors 154, 156, 160, 162 in the outer sense amplifier section 120 therefore transition much faster than voltages that could be applied to the gates from the digit lines DL, DL* as in conventional sense amplifiers.

Power is subsequently applied to the outer sense amplifier section 120 at time $t_2$ in step 190 by transitioning the late NSENSE and PSENSE* signals to an active state, as shown in FIG. 4. The sense transistors 154, 156, 160, 162 then drive the digit lines DL, DL* to complementary logic levels corresponding to the data bit read from the memory cell capacitor in step 184 (the DL signal is shown by the solid line, and the DL* signal is shown by the dotted line). The voltages on the digit lines DL, DL* transition at a relatively fast rate compared to digit lines driven by conventional sense amplifiers because the voltages on the gates of the sense transistors 154, 156, 160, 162 are already at voltages that strongly turn ON the sense transistors 154, 156, 160, 162 before the voltages on the digit lines DL, DL* have changed appreciably. In contrast, if the gates of the sense transistors 154, 156, 160, 162 were coupled to the digit lines DL, DL*, the sense transistors 154, 156, 160, 162 may not have the drive strength needed to discern the slight voltage difference or they would switch at the relatively slow rate commensurate with the speed at which the differential voltage between the digit lines DL, DL* increases. The voltages on the digit lines DL, DL* reach complementary logic levels corresponding to the read data bit at time $t_3$ to refresh the memory cell capacitor coupled to the digit line DL at step 194, thereby completing the read memory access.

The initial operation of the sense amplifier 100 for a write memory access is similar to the above-described operation for a read memory access since a write memory access always starts out as a read memory access and does not transition to a write memory access until the WRITE signal transitions active high when the memory device receives a column address and a column address strobe signal. The transitioning of the WRITE signal causes the write memory access to differ from the read memory access because NAND gate 170 outputs a high to turn ON the coupling transistors 150, 152 after the early NSENSE signal has transitioned active high. As a result, the inner sense amplifier section 110 continues to be connected to the outer sense amplifier section 120. Furthermore, the active high WRITE signal causes the NAND gate to output a high even when the late NSENSE signal is active to maintain the negative supply transistor 164 OFF.

The high speed operation of the first sense amplifier section 110 is further enhanced by coupling the sense transistors 140, 142 to a negative voltage $V_{BB}$ rather than to ground. However, this negative voltage $V_{BB}$ can easily be supplied by conventional sources, such as a charge pump (not shown), because it is only necessary to drive the sense lines S, S*. If it was also necessary to drive the digit lines DL, DL*, substantially more current at the negative voltage VBB would be required.

Figure 5:
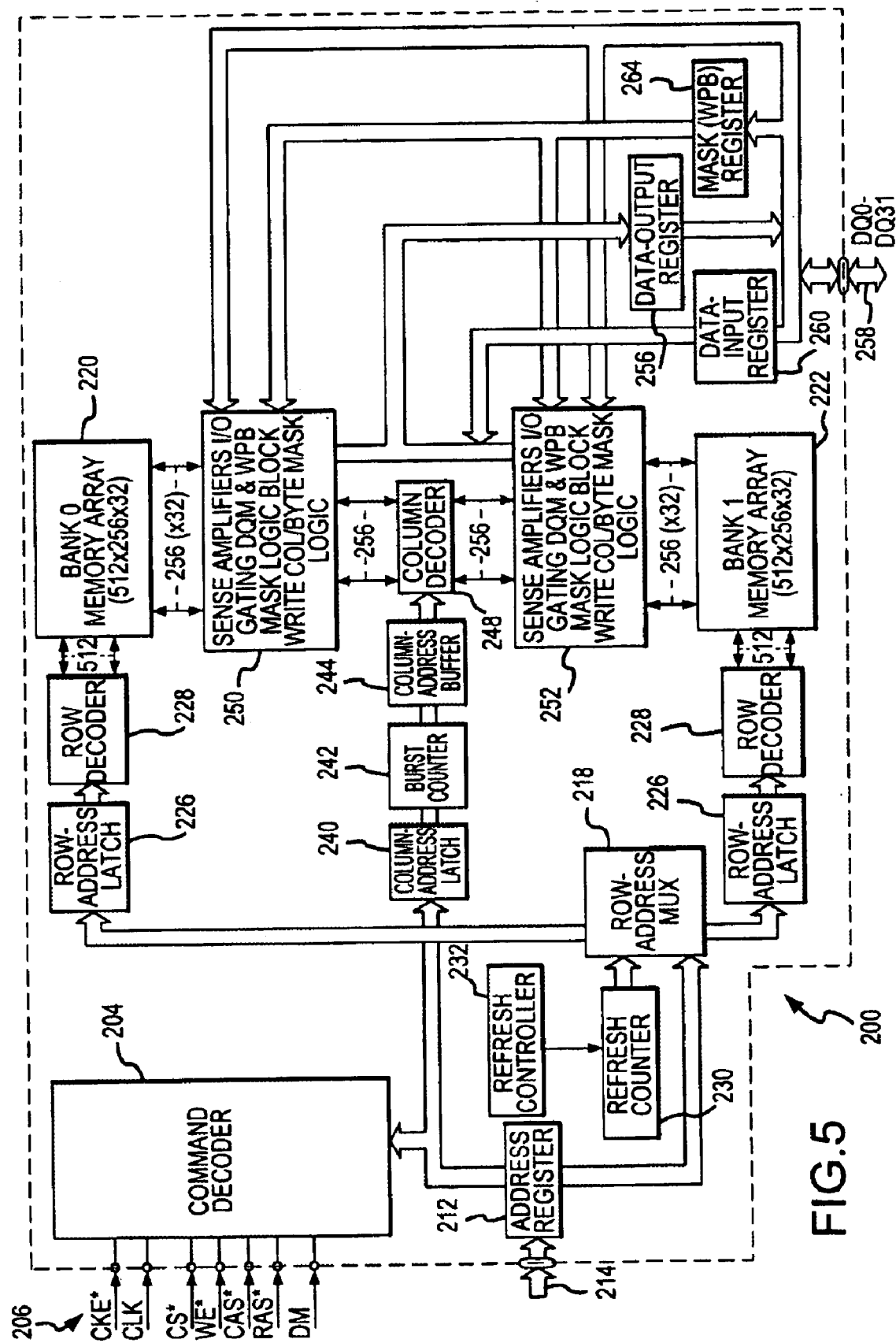
FIG. 5 is a block diagram of a memory device using the sense amplifier of FIG. 2 or some other embodiment of a sense amplifier accordance with the present invention.

FIG. 5 is a block diagram of a conventional synchronous dynamic random access memory ("SDRAM") 200 that utilizes the sense amplifier 100 (FIG. 2) or some other embodiment of the invention. Of course, the sense amplifier 100 and other embodiments of the invention can also be used in other DRAM devices and other memory devices, such as SRAM devices, FLASH memory devices, etc.

The operation of the SDRAM 200 is controlled by a command decoder 204 responsive to high-level command signals received on a control bus 206. These high level command signals, which are typically generated by a memory controller (not shown in FIG. 5), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled to a memory controller (not shown in FIG. 5). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242, which applies a sequence of column addresses to the column address buffer 244 starting at the column address output by the address register 212. In either case, the column address buffer 244 applies a column address to a column decoder 248.

Data to be read from one of the arrays 220, 222 is coupled to column circuitry 250, 252 (i.e., sense amplifiers, I/O gating, DQM &WPB mask logic, block write col./byte mask logic) for one of the arrays 220, 222, respectively. The column circuitry 250, 252 may include for each column of memory cells in the arrays 220, 222 the equilibration circuit 34 (FIG. 1) and the sense amplifier 100 or a sense amplifier according to some other embodiment of the invention. The data bits developed by the sense amplifier 100 are then coupled to a data output register 256. Data to be written to one of the arrays 220, 222 are coupled from the data bus 258 through a data input register 260. The write data are coupled to the column circuitry 250, 252 where they are transferred to one of the arrays 220, 222, respectively. A mask register 264 responds to a data mask DM signal to selectively alter the flow of data into and out of the column circuitry 250, 252, such as by selectively masking data to be read from the arrays 220, 222.

Figure 6:
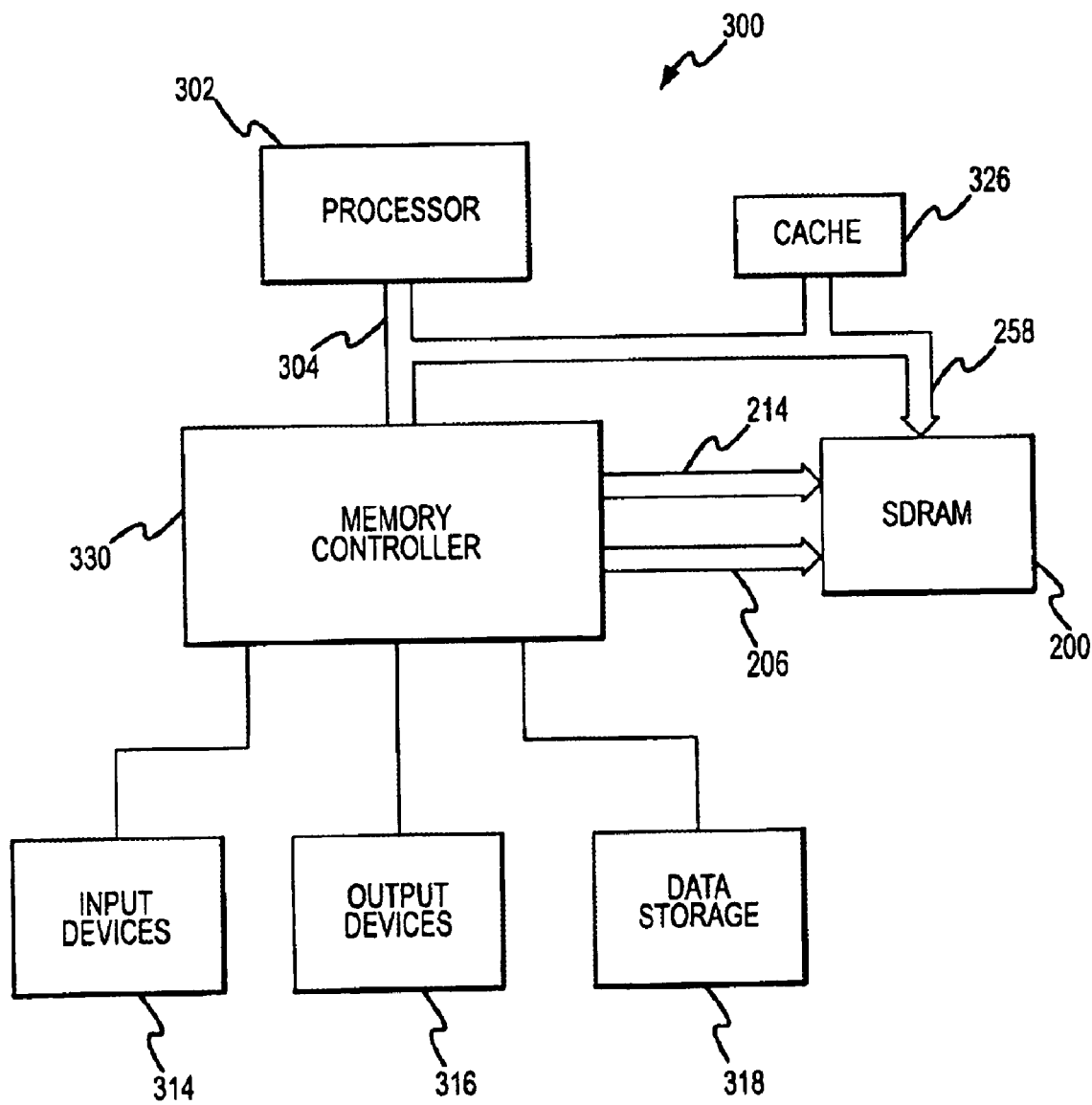
FIG. 6 is a block diagram of a computer system using the memory device of FIG. 5.

FIG. 6 shows an embodiment of a computer system 300 that may use the SDRAM 200 or some other memory device that uses the sense amplifier 100 or some other embodiment of the invention. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to a cache memory 326, which is usually static random access memory ("SRAM") and to the SDRAM 200 through a memory controller 330. The memory controller 330 includes an address bus 214 (FIG. 5) to couple row addresses and column addresses to the DRAM 200. The memory controller 330 also includes a control bus that couples command signals to a control bus 206 of the SDRAM 200. The external data bus 258 of the SDRAM 200 is coupled to the data bus of the processor 302, either directly or through the memory controller 330.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device, comprising:
   a row address circuit operable to receive and decode row address signals applied to external address terminals of the memory device;
   a column address circuit operable to receive and decode column address signals applied to the external address terminals;
   at least one array of memory cells arranged in rows and columns, each of the memory cells being operable to store a data bit written to or read from the array at a location determined by the decoded row address signals and the decoded column address signals;
   a plurality of sense amplifiers provided for respective columns of memory cells in the at least one array, each of the sense amplifiers comprising:
      a first sense amplifier section comprising:
         first and second complementary sense lines;
         a first p-channel sense transistor having its source and drain coupled between the first sense line and a first voltage, and its gate coupled to the second sense line;
         a second p-channel sense transistor having its source and drain coupled between the second sense line and the first voltage, and its gate coupled to the first sense line;
         a first n-channel sense transistor having its source and drain coupled between the first sense line and a second voltage, and its gate coupled to the second sense line;
         a second n-channel sense transistor having its source and drain coupled between the second sense line and the second voltage, and its gate coupled to the first sense line;
      a second sense amplifier section comprising:
         a pair of complementary digit lines;
         a first p-channel sense transistor having its source and drain coupled between the first digit line and a third voltage, and its gate coupled to the second sense line;
         a second p-channel sense transistor having its source and drain coupled between the second digit line and the third voltage, and its gate coupled to the first sense line;
         a first n-channel sense transistor having its source and drain coupled between the first digit line and a fourth voltage, and its gate coupled to the second sense line;
         a second n-channel sense transistor having its source and drain coupled between the second digit line and the fourth voltage, and its gate coupled to the first sense line;
      a first coupling transistor having its source and drain coupled between the first sense line and the first digit line; and
      a second coupling transistor having its source and drain coupled between the second sense line and the second digit line;
      a control circuit coupled to the gate of the first and second coupling transistors, the control circuit being operable to apply signals to the first and second coupling transistor that cause them to couple the first sense line to the first digit line and to couple the second sense line to the second digit line at the start of a memory read operation and to thereafter isolate the first sense line from the first digit line and to isolate the second sense line from the second digit line;
   a data path circuit operable to couple data signals corresponding to the data bits between the sense amplifiers and external data terminals of the memory device; and
   a command decoder operable to decode a plurality of command signals applied to respective external command terminals of the memory device, the command decoder being operable to generate control signals corresponding to the decoded command signals.

2. The memory device of claim 1 wherein the first voltage and the third voltage are equal to each other.

3. The memory device of claim 2 wherein the first and third voltage comprise a positive voltage.

4. The memory device of claim 1 wherein the second voltage and the fourth voltage are different from each other.

5. The memory device of claim 4 wherein the second voltage comprises a negative voltage and the fourth voltage comprises zero volts.

6. The memory device of claim 1, further comprising a control circuit coupled to a gate of the first coupling transistor and to a gate of the second coupling transistor.

7. The memory device of claim 6 wherein the coupling transistors comprise respective n-channel transistors.

8. The memory device of claim 1 wherein the memory device comprises a dynamic random access memory device.

9. The memory device of claim 8 wherein the dynamic random access memory device comprises a synchronous dynamic random access memory device.

10. A memory device, comprising:
a row address circuit operable to receive and decode row address signals applied to external address terminals of the memory device;
a column address circuit operable to receive and decode column address signals applied to the external address terminals;
at least one array of memory cells arranged in rows and columns, each of the memory cells being operable to store a data bit written to or read from the array at a location determined by the decoded row address signals and the decoded column address signals;
a plurality of sense amplifiers provided for respective columns of memory cells in the at least one array, each of the sense amplifiers comprising:
a first sense amplifier section having complementary first and second output terminals and complementary first and second input terminals, the first input terminal being coupled to the second output terminal, and the second input terminal being coupled to the first output terminal;
a second sense amplifier section having complementary first and second output terminals and complementary first and second input terminals, the first input terminal being coupled to the second output terminal of the first sense amplifier section, and the second input terminal being coupled to the first output terminal of the first sense amplifier section; and
a coupling circuit configured to couple the first output terminal of the first sense amplifier section to the first output terminal of the second sense amplifier section at the start of a memory read operation, and to couple the second output terminal of the first sense amplifier section to the second output terminal of the second sense amplifier section at the start of the memory read operation, the coupling circuit configured to thereafter during the memory read operation isolate the first output terminal of the first sense amplifier section from the first output terminal of the second sense amplifier section and to isolate the second output terminal of the first sense amplifier section from the second output terminal of the second sense amplifier section;
a data path circuit operable to couple data signals corresponding to the data bits between the sense amplifiers and external data terminals of the memory device; and
a command decoder operable to decode a plurality of command signals applied to respective external command terminals of the memory device, the command decoder being operable to generate control signals corresponding to the decoded command signals.

11. The memory device of claim 10 wherein the coupling circuit comprises:
a first switch coupling the first output terminal of the first sense amplifier section to the first output terminal of the second sense amplifier section, the first switch having a control terminal; and
a second switch coupling the second output terminal of the first sense amplifier section to the second output terminal of the second sense amplifier section, the second switch having a control terminal.

12. The memory device of claim 11 wherein the first and second switches comprise respective FET transistors.

13. The memory device of claim 10, further comprises a first switch through which a first power supply voltage is coupled to the first sense amplifier section, a second switch through which a second power supply voltage is coupled to the first sense amplifier section, a third switch through which a third power supply voltage is coupled to the second sense amplifier section, and a fourth switch through which a fourth power supply voltage is coupled to the second sense amplifier section.

14. The memory device of claim 13 wherein the first, second, third and fourth switches comprise respective FET transistors.

15. The memory device of claim 13 wherein the first power supply voltage is the same as the third power supply voltage, and the second power supply voltage is different from the fourth power supply voltage.

16. The memory device of claim 15 wherein the first and second power supply voltages are positive, the second power supply voltage is negative, and the fourth power supply voltage is zero volts.

17. The memory device of claim 10 wherein the memory device comprises a dynamic random access memory device.

18. The memory device of claim 17 wherein the dynamic random access memory device comprises a synchronous dynamic random access memory device.

19. A computer system, comprising:
a processor having a processor bus;
an input device coupled to the processor through the processor bus to allow data to be entered into the computer system;
an output device coupled to the processor through the processor bus to allow data to be output from the computer system;
a data storage device coupled to the processor through the processor bus to allow data to be read from a mass storage device;
a memory controller coupled to the processor through the processor bus; and
a memory device coupled to the memory controller, the memory device comprising:
a row address circuit operable to receive and decode row address signals applied to external address terminals of the memory device;
a column address circuit operable to receive and decode column address signals applied to the external address terminals;
at least one array of memory cells arranged in rows and columns, each of the memory cells being operable to store a data bit written to or read from the array at a location determined by the decoded row address signals and the decoded column address signals;
a plurality of sense amplifiers provided for respective columns of memory cells in the at least one array, each of the sense amplifiers comprising:
a first sense amplifier section comprising:
first and second complementary sense lines;
a first p-channel sense transistor having its source and drain coupled between the first sense line and a first voltage, and its gate coupled to the second sense line;
a second p-channel sense transistor having its source and drain coupled between the second sense line and the first voltage, and its gate coupled to the first sense line;
a first n-channel sense transistor having its source and drain coupled between the first sense line and a second voltage, and its gate coupled to the second sense line;
a second n-channel sense transistor having its source and drain coupled between the second sense line and the second voltage, and its gate coupled to the first sense line;
a second sense amplifier section comprising:
a pair of complementary digit lines;
a first p-channel sense transistor having its source and drain coupled between the first digit line and a third voltage, and its gate coupled to the second sense line;
a second p-channel sense transistor having its source and drain coupled between the second digit line and the third voltage, and its gate coupled to the first sense line;
a first n-channel sense transistor having its source and drain coupled between the first digit line and a fourth voltage, and its gate coupled to the second sense line;
a second n-channel sense transistor having its source and drain coupled between the second digit line and the fourth voltage, and its gate coupled to the first sense line;
a first coupling transistor having its source and drain coupled between the first sense line and the first digit line; and
a second coupling transistor having its source and drain coupled between the second sense line and the second digit line;
a control circuit coupled to the date of the first and second coupling transistors, the control circuit being operable to apply signals to the first and second coupling transistor that cause them to couple the first sense line to the first digit line and to couple the second sense line to the second digit line at the start of a memory read operation and to thereafter isolate the first sense line from the first digit line and to isolate the second sense line from the second digit line;
a data path circuit operable to couple data signals corresponding to the data bits between the sense amplifiers and external data terminals of the memory device; and
a command decoder operable to decode a plurality of command signals applied to respective external command terminals of the memory device, the command decoder being operable to generate control signals corresponding to the decoded command signals.

20. The computer system of claim 19 wherein the first voltage and the third voltage are equal to each other.

21. The computer system of claim 20 wherein the first and third voltage comprise a positive voltage.

22. The computer system of claim 19 wherein the second voltage and the fourth voltage are different from each other.

23. The computer system of claim 22 wherein the second voltage comprises a negative voltage and the fourth voltage comprises zero volts.

24. The computer system of claim 19, further comprising a control circuit coupled to a gate of the first coupling transistor and to a gate of the second coupling transistor.

25. The computer system of claim 24 wherein the coupling transistors comprise respective n-channel transistors.

26. The computer system of claim 19 wherein the memory device comprises a dynamic random access memory device.

27. The computer system of claim 26 wherein the dynamic random access memory device comprises a synchronous dynamic random access memory device.

28. A computer system, comprising:
a processor having a processor bus;
an input device coupled to the processor through the processor bus to allow data to be entered into the computer system;
an output device coupled to the processor through the processor bus to allow data to be output from the computer system;
a data storage device coupled to the processor through the processor bus to allow data to be read from a mass storage device;
a memory controller coupled to the processor through the processor bus; and
a memory device coupled to the memory controller, the memory device comprising:
a row address circuit operable to receive and decode row address signals applied to external address terminals of the memory device;
a column address circuit operable to receive and decode column address signals applied to the external address terminals;
at least one array of memory cells arranged in rows and columns, each of the memory cells being operable to store a data bit written to or read from the array at a location determined by the decoded row address signals and the decoded column address signals;
a plurality of sense amplifiers provided for respective columns of memory cells in the at least one array, each of the sense amplifiers comprising:
a first sense amplifier section having complementary first and second output terminals and complementary first and second input terminals, the first input terminal being coupled to the second output terminal, and the second input terminal being coupled to the first output terminal;
a second sense amplifier section having complementary first and second output terminals and complementary first and second input terminals, the first input terminal being coupled to the second output terminal of the first sense amplifier section, and the second input terminal being coupled to the first output terminal of the first sense amplifier section; and
a coupling circuit configured to couple the first output terminal of the first sense amplifier section to the first output terminal of the second sense amplifier section at the start of a memory read operation, and to couple the second output terminal of the first sense amplifier section to the second output terminal of the second sense amplifier section at the start of the memory read operation, the coupling circuit configured to thereafter during the memory read operation isolate the first output terminal of the first sense amplifier section from the first output terminal of the second sense amplifier section and to isolate the second output terminal of the first sense amplifier section from the second output terminal of the second sense amplifier section;
a data path circuit operable to couple data signals corresponding to the data bits between the sense amplifiers and external data terminals of the memory device; and
a command decoder operable to decode a plurality of command signals applied to respective external command terminals of the memory device, the command decoder being operable to generate control signals corresponding to the decoded command signals.

29. The computer system of claim 28 wherein the coupling circuit comprises:
a first switch coupling the first output terminal of the first sense amplifier section to the first output terminal of the second sense amplifier section, the first switch having a control terminal; and
a second switch coupling the second output terminal of the first sense amplifier section to the second output terminal of the second sense amplifier section, the second switch having a control terminal.

30. The computer system of claim 29 wherein the first and second switches comprise respective FET transistors.

31. The computer system of claim 28, further comprises a first switch through which a first power supply voltage is coupled to the first sense amplifier section, a second switch through which a second power supply voltage is coupled to the first sense amplifier section, a third switch through which a third power supply voltage is coupled to the second sense amplifier section, and a fourth switch through which a fourth power supply voltage is coupled to the second sense amplifier section.

32. The computer system of claim 31 wherein the first, second, third and fourth switches comprise respective FET transistors.

33. The computer system of claim 31 wherein the first power supply voltage is the same as the third power supply voltage, and the second power supply voltage is different from the fourth power supply voltage.

34. The computer system of claim 33 wherein the first and third power supply voltages are positive, the second power supply voltage is negative, and the fourth power supply voltage is zero volts.

35. The computer system of claim 28 wherein the memory device comprises a dynamic random access memory device.

36. The computer system of claim 35 wherein the dynamic random access memory device comprises a synchronous dynamic random access memory device.

37. A method of reading a data bit from a memory cell, comprising:
providing a first sense amplifier having a pair of complementary inputs and a pair of complementary outputs;
providing a second sense amplifier having a pair of complementary inputs and a pair of complementary outputs, the complementary inputs being coupled to the corresponding complementary outputs of the first sense amplifier, and the complementary outputs being coupled to respective complementary digit lines;
coupling a memory cell to one of the complimentary digit lines;
coupling the complementary inputs of the first sense amplifier to respective ones of the digit lines during an initial sensing period after coupling the memory cell to one of the complimentary digit lines;
isolating the first sense amplifier from the digit lines and applying power to the first sense amplifier to allow the first sense amplifier to respond to the a voltage imparted to one of the complimentary digit lines by the memory cell;
after applying power to the first sense amplifier, applying power to the second sense amplifier to allow the second sense amplifier to drive the complimentary digit line to logic levels corresponding to a voltage stored in the memory cell; and
coupling the digit lines through respective input/output lines.

38. The method of claim 37 wherein the act of applying power to the first sense amplifier comprises applying a positive supply voltage and a negative supply voltage to the first sense amplifier.

39. The method of claim 38 wherein the act of applying power to the second sense amplifier comprises applying a positive supply voltage and ground to the second sense amplifier.

40. The method of claim 37 wherein the act of coupling the complementary inputs of the first sense amplifier to respective ones of the digit lines during an initial sensing period comprises coupling the complementary inputs of the first sense amplifier to respective ones of the digit lines before and after coupling the memory cell to one of the complimentary digit lines.

41. A memory device, comprising:
a row address circuit operable to receive and decode row address signals applied to external address terminals of the memory device;
a column address circuit operable to receive and decode column address signals applied to the external address terminals;
at least one array of memory cells arranged in rows and columns, each of the memory cells being operable to store a data bit written to or read from the array at a location determined by the decoded row address signals and the decoded column address signals;
a plurality of sense amplifiers provided for respective complimentary first and second digit lines provided for respective columns of memory cells in the at least one array, each of the sense amplifiers comprising:
a first sense amplifier section having complementary first and second output terminals and complementary first and second input terminals, the first input terminal being coupled to the second digit line at the start of a memory read operation and thereafter isolated from the second digit line during substantially all of the remainder of the memory read operation, and the second input terminal being coupled to the first digit line at the start of the memory read operation and thereafter isolated from the first digit line during substantially all of the remainder of the memory read operation;
isolated from the digit lines during substantially all of the remainder of the memory read operation
a second sense amplifier section having complementary first and second output terminals and complementary first and second input terminals, the first input terminal being coupled to the second output terminal of the first sense amplifier section, the second input terminal being coupled to the first output terminal of the first sense amplifier section, the first output terminal of the second sense amplifier section being coupled to the first digit line, and the second output terminal of the second sense amplifier section being coupled to the second digit line;
a data path circuit operable to couple data signals corresponding to the data bits between the sense amplifiers and external data terminals of the memory device; and
a command decoder operable to decode a plurality of command signals applied to respective external command terminals of the memory device, the command decoder being operable to generate control signals corresponding to the decoded command signals.

42. The memory device of claim 41, further comprising a first switch through which a first power supply voltage is coupled to the first sense amplifier section, a second switch through which a second power supply voltage is coupled to the first sense amplifier section, a third switch through which a third power supply voltage is coupled to the second sense amplifier section, and a fourth switch through which a fourth power supply voltage is coupled to the second sense amplifier section.

43. The memory device of claim 42 wherein the first, second, third and fourth switches comprise respective FET transistors.

44. The memory device of claim 42 wherein the first power supply voltage is the same as the third power supply voltage, and the second power supply voltage is different from the fourth power supply voltage.

45. The memory device of claim 44 wherein the first and second power supply voltages are positive, the second power supply voltage is negative, and the fourth power supply voltage is zero volts.

46. The memory device of claim 41 wherein the memory device comprises a dynamic random access memory device.

47. The memory device of claim 46 wherein the dynamic random access memory device comprises a synchronous dynamic random access memory device.

48. A method of reading a data bit from a memory cell, comprising:

providing a first sense amplifier having a pair of complementary inputs and a pair of complementary outputs;

providing a second sense amplifier having a pair of complementary inputs and a pair of complementary outputs, the complementary inputs being coupled to the corresponding complementary outputs of the first sense amplifier, and the complementary outputs being coupled to respective complementary digit lines;

coupling a memory cell to one of the complimentary digit lines;

after coupling the memory cell to one of the complimentary digit lines, coupling the complementary inputs of the first sense amplifier to respective ones of the digit lines during an initial sensing period of a memory read operation; and after the initial sensing period of the memory read operation, isolating the first sense amplifier from the digit lines during the memory read operation to allow the first sense amplifier to drive the second sense amplifier without also driving the digit lines while the second sense amplifier drives the digit lines during the memory read operation.

49. The method of claim 37 wherein the act of coupling the complementary inputs of the first sense amplifier to respective ones of the digit lines during an initial sensing period of the memory read operation comprises coupling the complementary inputs of the first sense amplifier to respective ones of the digit lines before and after coupling the memory cell to one of the complimentary digit lines.

* * * * *

UNITED STATES PATENT AND TRADEMARK OFFICE
CERTIFICATE OF CORRECTION

PATENT NO. : 6,950,368 B2
APPLICATION NO. : 10/374376
DATED : September 27, 2005
INVENTOR(S) : Donald M. Morgan It is certified that error appears in the above-identified patent and that said Letters Patent is hereby corrected as shown below:

| Column, Line | Reads | Should Read |
|---|---|---|
| Column 1, Line 21 | "DL, DL*for each column" | --DL, DL* for each column-- |
| Column 2, Line 33 | "complimentary" | --complementary-- |
| Column 2, Line 43 | "has driven in the digit line" | --has drive the digit line-- |
| Column 2, Line 58 | "threshold voltages $V_T$" | --threshold voltage $V_T$-- |
| Column 3, Line 37 | "sense amplifier accordance" | --sense amplifier in accordance-- |
| Column 4, Line 34 | "compliment" | --complement-- |
| Column 4, Line 46 | "with reference to flow" | --with reference to the flow-- |
| Column 5, Line 64 | "VBB would be required | --$V_{BB}$ would be required.-- |
| Column 13, Line 14 | "further comprises" | --further comprising-- |
| Column 13, Lines 50, 55, 59 and 63 | "complimentary" | --complementary-- |
| Column 13, Line 58 | "to respond to the a voltage" | --to respond to a voltage-- |
| Column 14, Line 30 | "complimentary" | --complementary-- |
| Column 14, Lines 44-47 | "remainder of the memory read operation; isolated from the digit lines during substantially all of the remainder of the memory read operation; a second sense amplifier section having complementary" | --remainder of the memory read operation; a second sense amplifier section having complementary-- |

UNITED STATES PATENT AND TRADEMARK OFFICE
CERTIFICATE OF CORRECTION

PATENT NO. : 6,950,368 B2
APPLICATION NO. : 10/374376
DATED : September 27, 2005
INVENTOR(S) : Donald M. Morgan It is certified that error appears in the above-identified patent and that said Letters Patent is hereby corrected as shown below:

| Column, Line | Reads | Should Read |
|---|---|---|
| Column 16, Lines 8-9 and 27 | "complimentary" | --complementary-- |

Signed and Sealed this

Fourth Day of December, 2007

JON W. DUDAS
*Director of the United States Patent and Trademark Office*